United States Patent [19]

McCormick et al.

[11] 4,438,406

[45] Mar. 20, 1984

[54] SIGNAL PROCESSING MEANS ACTING AS A FREQUENCY RANGE TRANSLATOR AND AS A FILTER

[75] Inventors: Michael A. McCormick, Hucknall; Peter Gladdish, Holbrook, both of England

[73] Assignee: Rolls-Royce Limited, London, England

[21] Appl. No.: 432,824

[22] Filed: Oct. 5, 1982

[30] Foreign Application Priority Data

Oct. 15, 1981 [GB] United Kingdom ............... 8131074

[51] Int. Cl.$^3$ ...................... H03B 19/06; H03F 3/68
[52] U.S. Cl. .................................. 328/167; 330/126; 330/295; 330/306; 328/15
[58] Field of Search ............... 330/126, 129, 278, 279, 330/295, 305, 306; 307/271, 522, 543; 328/140, 167, 15, 16, 20

[56] References Cited

U.S. PATENT DOCUMENTS 3,808,543 4/1974 Mueller ............................ 328/20 X Primary Examiner—James B. Mullins
Assistant Examiner—Steven J. Mottola
Attorney, Agent, or Firm—Cushman, Darby & Cushman

[57] ABSTRACT

A signal processor for use in association with a frequency analyzer, can operate in the frequency translation mode or the filter mode.

The signal processor comprises a first low pass filter, the signal from which is fed to two first parallel programmable gain amplifiers controlled by a first digital function controller. The signals then pass via two, second low pass filters to two second programmable gain amplifiers controlled by a second digital function controller. The signals from the second amplifiers are then added by an adder and filtered by a third low pass filter.

The first controller is controlled by a frequency signal equal to the frequency in the middle of the bandwidth being translated and the first filter is controlled by a frequency which is a multiple of the control frequency to the first controller.

In the range translation mode, the second filters and second controller have a control signal equal to the bandwidth frequency and the third filter is controlled by a signal which is a multiple of the control signal to the second filter and the second controller.

In the filter mode, the control signals to the first and second controllers are equal to each other and the control signals to the first and third are equal to each other.

14 Claims, 10 Drawing Figures

INPUT SPECTRA

OUTPUT SPECTRA

FIG.2

STEADY

FIG.4

JITTERING

SIGNAL PROCESSING MEANS ACTING AS A FREQUENCY RANGE TRANSLATOR AND AS A FILTER

This invention relates to a signal processing means which forms part of, or which can be used in conjunction with frequency analysers. The invention is concerned both with filtering a band of frequencies $f_1 \rightarrow f_2$ and modifying the signal so that this band of frequencies is translated to the range $0 \rightarrow (f_2 - f_1)$ the signal processing means acting as a frequency range translation unit, and with arranging the signal processing means so that it acts as a constant bandwidth filter only, the frequency and bandwidth of which can be controlled by external electrical signals. The bandwith can be infintely variable, as opposed to most filters which have sets of fixed bandwidths. The signal processing means may also be arranged to function as a constant percentage bandwidth filter.

In the case where the signal to be analysed is derived from the acoustic emissions of the fan of a gas turbine engine, the spectrum of this signal whilst nominally constant will be subject to a jitter due to non-uniformities in the rotational speed of the fan. Some frequency analysers can eliminate the jitter by tracking the signal. The signal process means of the present invention can be used with such analysers to examine in finer detail part of the "de-jittered" spectrum. In this case, the band of frequencies $f_1 \pm \Delta\% \rightarrow f_2 \pm \Delta\%$ is translated into the range $0 \pm \Delta\% \rightarrow (f_2 - f_1) \pm \Delta\%$, where $\Delta$ represents the jitter.

Frequency translation or conversion can be accomplished in two ways, firstly by 'heterodyning' and secondly by multiplying the input signal by a second signal of known frequency. The latter of these is considered to be superior, but signals having unwanted frequencies are generated in the process and these have to be eliminated. The multiplying signal can take various forms e.g. a Sine-wave which will produce few unwanted frequencies but is somewhat difficult to control for the 'tracking' application, or a square wave which will produce many unwanted frequencies, but is correspondingly easier to control. Multiplication can be accomplished either by analogue or digital means, both having disadvantages of varying degrees.

The present invention provides effective multiplication by a digitally controlled variable gain amplifier which effectively eliminates the problems of wholly analogue or digital multiplying operations, including all difficulties associated with tracking.

In order to eliminate the unwanted frequencies, the invention uses both filters and a cancellation process, which requires the input signal to be multiplied by two signals differing in phase by 90°. The multiplying signals take the form of digital approximations to a sine wave and a cosine wave.

An external signal of periodic form is used to control the frequency band to be translated, or filtered when the signal processing means is used purely as a filter. The external signal can be obtained from a number of sources such as, an electrical oscillator, the frequency analyser that is being used in conjunction with the signal processing means or from a tachometer in the case where translation of a jittering signal is being undertaken.

According to the present invention, there is provided a signal processing means comprising first filter means arranged to receive an input signal, two first programmable gain amplifier means arranged to receive a signal from the first filter means and controlled by first digital function controller means, second filter means arranged to receive the signals from the two first programmable gain amplifier means, two second programmable gain amplifier means arranged to receive the two signals from the second filter means and controlled by second digital function controller means, means for adding the output signals from the two second programmable gain amplifier means, third filter means arranged to receive the signal from the adding means, and control frequency derivator means arranged to control the first, second and third filter means and the first and second digital function controller means, the control frequency derivator means being controlled by a centre frequency control input signal, and a bandwidth control input signal.

The signal processing means can act as a frequency range translator in which case the first filter means and first digital function controller means both receive different control signals from the control frequency derivator means which are functions of the centre frequency control signal, this latter signal being related to the centre frequency of the frequency bandwidth to be translated, the second filter means receives a control signal related to the frequency of the bandwidth being translated and the third filter means and the second digital function controller means both receive different control signals which are functions of the signal received by the second filter means.

For the sake of convenience, the centre frequency control signal and the bandwidth control signal can be related so that only one signal is required, e.g. the bandwidth control signal, the center frequency control signal being derived internally or externally.

When the signal processing means acts as a filter, the control signals from the control signal derivator means are similar except that the control signal for the third filter means is now the same as that for the first filter means, and the control signal for the second digital function controller means is now the same as that for the first digital function controller means.

These two control signals are independent but if they are related, the signal processing means can operate as a constant percentage bandwidth filter.

The first, second and third filter means may all comprise low pass filters and the second filter means may comprise two low pass filters, one being associated with each first programmable gain amplifier means and perform the main filtering function to isolate the required band of frequencies.

The first and second digital function controller means each generate digital approximations to sine and cosine waves which are fed into respective ones of the first and second programmable amplifier means. The first and third filter means operate to compensate for the approximations made by the two digital function controller means.

The signal processing means preferably includes switching means to enable the control signals from the control frequency derivator to the second digital function controller means and the third filter means to be varied so that the signal processing means can be switched between the frequency range translation mode and the filter mode.

The centre frequency control signal input comprises the frequency which is equal to the frequency in the middle of the frequency band to be translated or filtered and the bandwidth control signal is equal to the frequency of half the bandwidth being translated or filtered.

The present invention will now be more particularly described with reference to the accompanying drawings in which.

Figure 1:
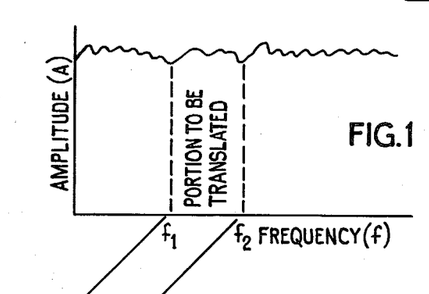
FIGS. 1 and 2 illustrate diagrammatically the range translation of a steady signal.
Figure 2:
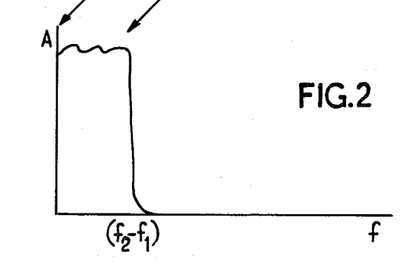

Referring to FIGS. 1 and 2, FIG. 1 shows a plot of signal amplitude against frequency and the band of frequencies, $f_1 \rightarrow f_2$ which is to be translated by the signal processing means operating as a range translator to be described with reference to FIG. 5, into the range $0 \rightarrow (f_2 - f_1)$.

Figure 3:
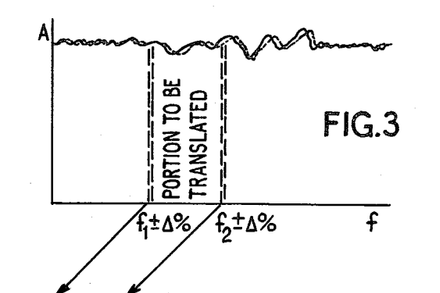
FIGS. 3 and 4 illustrate diagrammatically the range translation of a jittering signal.
Figure 4:
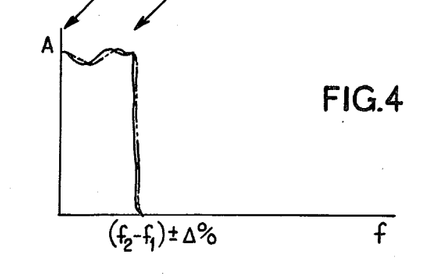

Referring to FIGS. 3 and 4, FIG. 3 shows a plot of the amplitude of a jittering signal, typical of a signal derived from the acoustic emissions of a gas turbine engine fan, against frequency. In FIG. 4, this jittering signal has been translated by the signal processing means according to the invention operating as a range translator to the range $0 \pm \Delta\% \rightarrow (f_2 - f_1) \pm \Delta\%$, where $\Delta$ represents the jitter In the signal processing means acting as a range translator shown in FIG. 5, the input signal first passes through a low pass filter 1 to correct for the approximation made in the first stage of the range translation process. The signal then splits and passes through two programmable gain amplifiers 2 and 3. These amplifiers are controlled by a digital function controller 10 which feed digital approximations to sine and cosine functions to the amplifiers 2 and 3 respectively. The resulting signals are then passed through low pass filters 4 and 5 which comprise the principal filtering stage. The second stage of the translation process is then carried out by the two programmable gain amplifiers 6 and 7 under the control of a digital function controller 11 which feed digital approximations to sine and cosine functions to the amplifiers 6 and 7 respectively. The two parallel signal paths are then reunited by an adder 8 and are finally low pass filtered by a filter 9 to eliminate the error signals generated during the second stage of the translation process. The low pass filters 1, 4, 5 and 9 and the digital function controllers 10 and 11 all receive control signals from the control signal derivator 12 which is in turn controlled by the external signal input to it.

The change from a range translator to a filter is effected by changing the control frequencies to the second stage digital function controller 11 and the low pass filter 9. In this mode, the bandwidth of the filter is controlled by a second input signal into the control frequency derivator 12.

Figure 5:
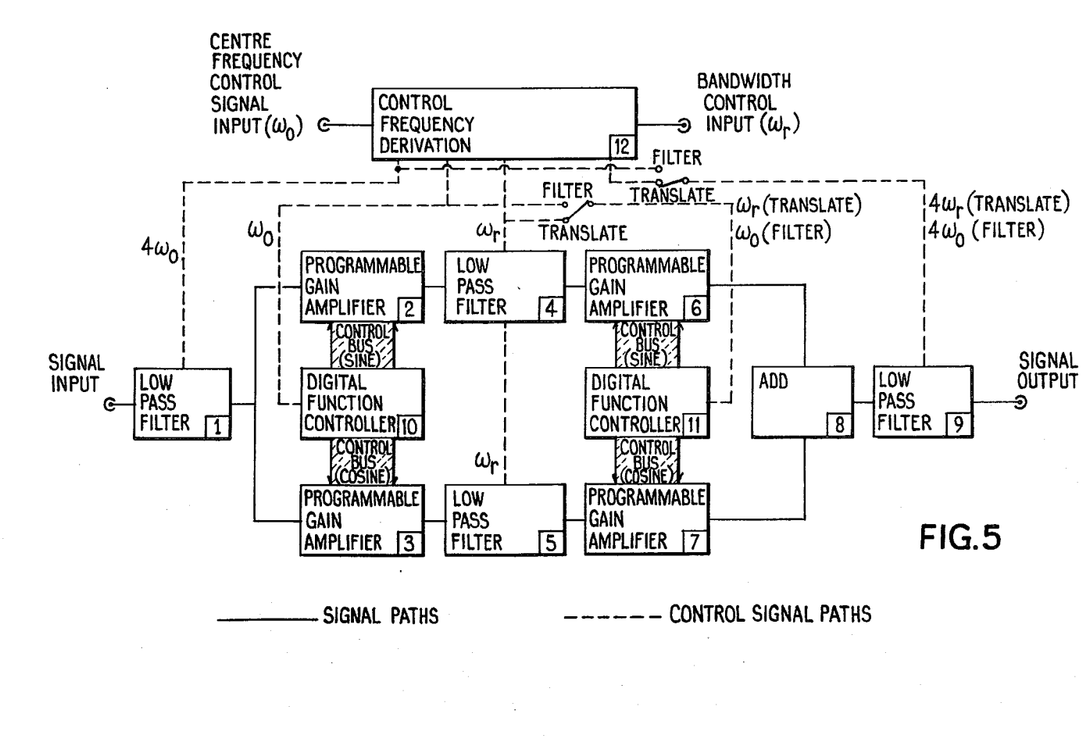
FIG. 5 is a block diagram of a signal processing means according to the present invention, FIG. 6 in conjunction with FIGS. 6a to 6e inclusive illustrates the functions of the elements of the signal processing means shown in FIG. 5 operating as a range translation means and the processed signal, respectively.
Figures 6, 6A, 6B, 6C, 6D, 6E:
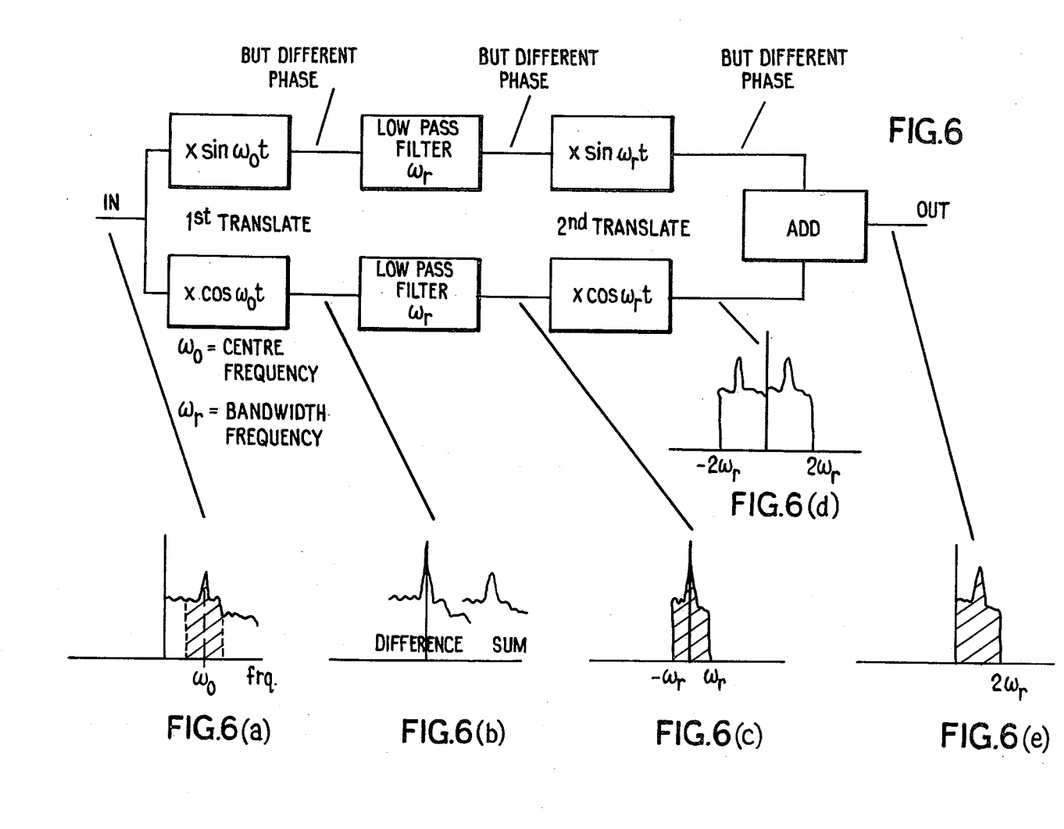

Referring now to FIG. 6 as well as FIG. 5, the input signal, which may for example, be related to the noise generated by the fan, compressor or turbine of a gas turbine engine, first passes through the low pass filter whose cut-off frequency is determined by a signal from the control frequency derivator 12. The derivator 12 has two inputs, a centre frequency control signal ($W_o$) which is in the middle of the frequency band to be translated or filtered and a bandwidth control signal ($W_r$) which is half the frequency bandwidth to be translated or filtered. In the embodiment, the low pass filter 1 cuts off the input signal at a frequency of 4 $W_o$ and this signal, as shown in FIG. 6(a) is then passed to each of the amplifiers 2 and 3, which comprise the first translation stage.

The digital function controller 10 which itself is controlled by the frequency signal $W_o$, feed signals Sin $W_o t$ and Cos $W_o T$, where t=time, to the amplifiers 2 and 3 respectively.

In the amplifiers, the input signal X is multiplied by Sin $W_o t$ and Cos $W_o t$ and the output signal of amplifier 3 is shown in FIG. 6(b), the output signal of amplifier 2 being the same but of a different phase. The output signals now consist of a difference signal centred on zero frequency, i.e. translated from $W_o$ and a sum signal.

The low pass filter 5 which is operating on a frequency of $W_r$, i.e. half the bandwidth of the frequency being translated, cuts-out the sum signal and the unwanted part of the difference signal creates the signal shown in FIG. 6(c). The filter 4 operates in the same way to modify the signal from the amplifier 2 to produce a signal the same as that shown in FIG. 6(c) but of a different phase.

FIG. 6(c) shows the theoretical signal with negative frequencies but in practice, the negative part of the spectrum is folded over the positive spectrum and cannot be unravelled without further modifying the signal. It is important to appreciate at this stage that because the filters 4 and 5 are operating at a low frequency, the response is optimally steep at the frequency Wr.

In the second translation stage, the signals from the filters 4 and 5 are multiplied by Sin $W_r t$ and Cos $W_r t$ respectively, the digital function controller 11 in this case being controlled by the frequency $W_r$, i.e. half the frequency bandwidth to be translated. The signal produced by the signal from amplifier 7 is shown in FIG. 6(d), the signal from amplifier 6 being the same but of different phase. Once again the spectrum shown is theoretical, since the signal having a theoretical negative frequency will be folded over the positive frequency signal and the signal will still not be of any value.

However, since the signals from amplifiers 6 and 7 are out of phase, they are added together in the adder 8, which cancels out the negative part of the frequency range to leave the signal shown in FIG. 6(e). This signal is the signal shown in FIG. 6(e) having a frequency range $W_o - W_r$ to $W_o + W_r$ translated to the frequency range 0 to 2 $W_r$. Although not shown in FIG. 6(e) the signal will also contain harmonics, once again generated because of the approximation method by which the sine and cosine waves for amplifiers 6 and 7 are produced. These signals are filtered by the low pass filter 9 which in this case, is arranged to cut off the frequencies above 4 $W_r$.

For the sake of convenience, $W_o$ can be related to $W_r$, so that only one input signal, preferably $W_r$ is generated, $W_o$ being derived therefrom either internally or externally of the signal processing means.

Figure 7:
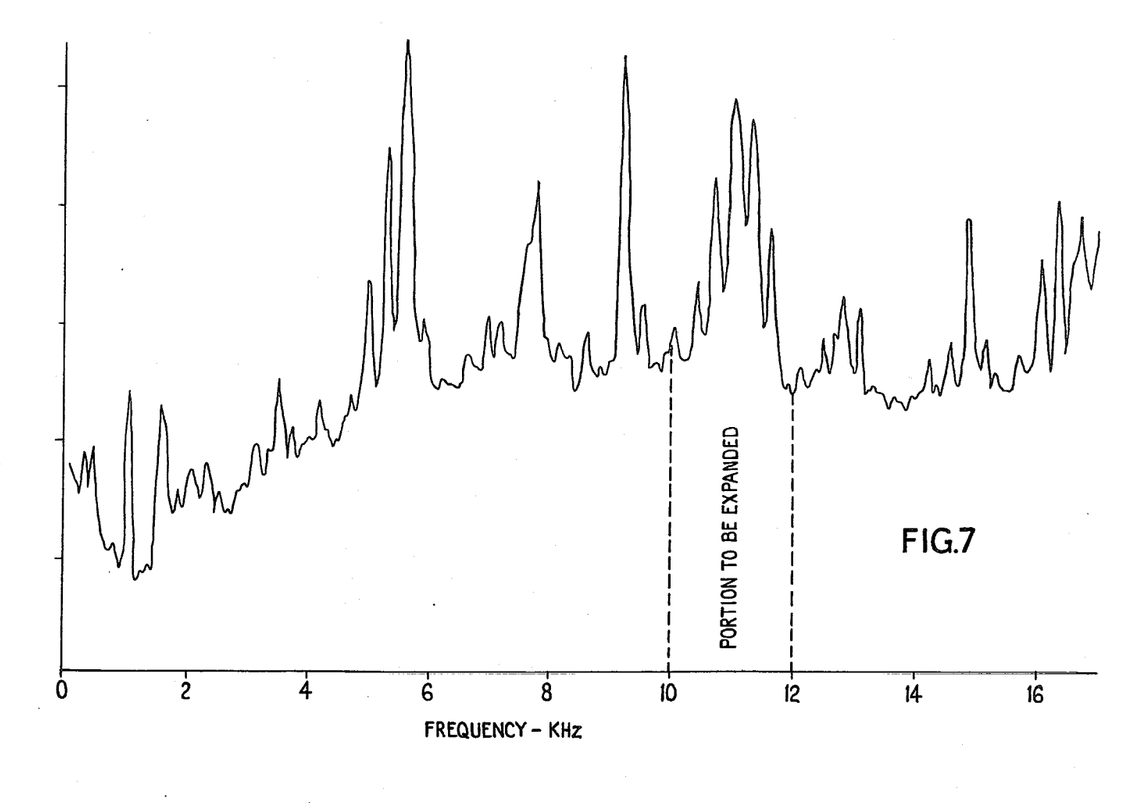
FIG. 7 shows a typical plot of noise v frequency from part of a gas turbine engine, which is to be analysed in detail by the means of the present invention.
Figure 8:
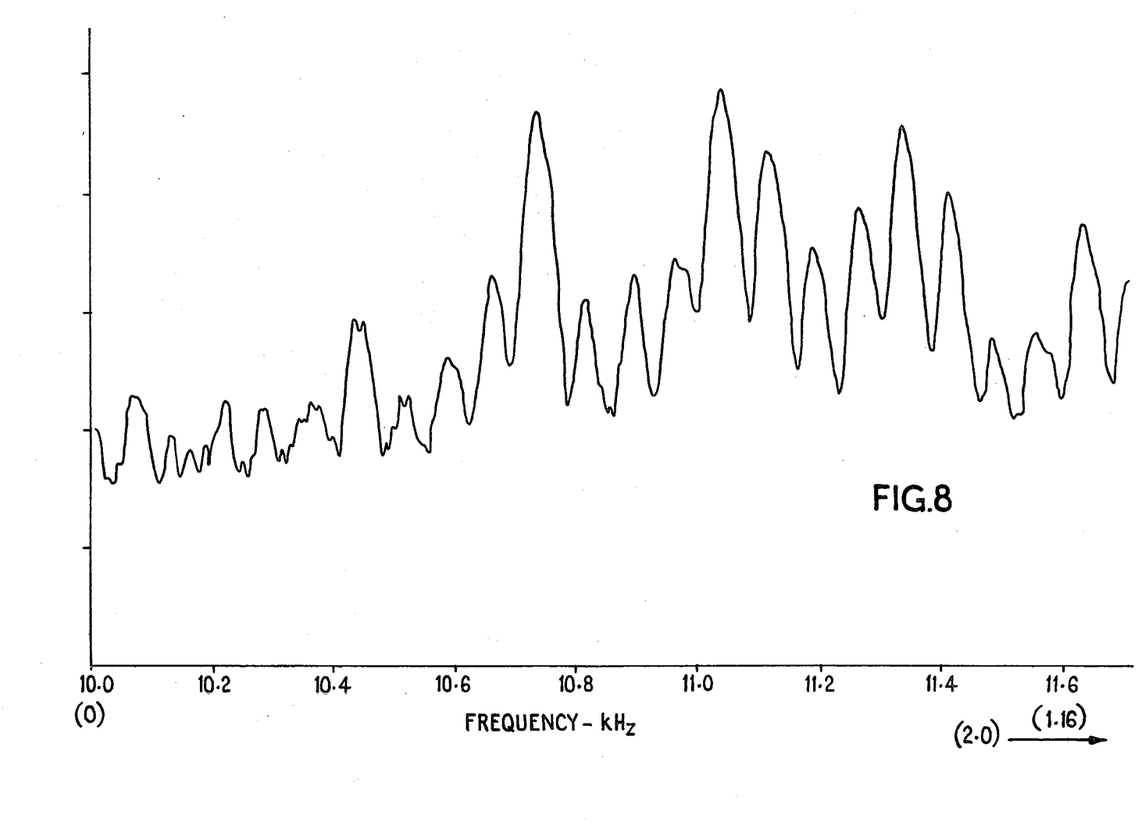
FIG. 8 shows part of the signal of FIG. 7 translated to a lower frequency range and expanded, FIG. 9 corresponds to FIG. 8 plotted to the scale of FIG. 7 illustrating the improved resolution obtained by the present invention and, FIG. 10 in conjunction with FIGS. 10a to 10e inclusive illustrates the functions of the signal processing means shown in FIG. 5 operating as a filter means and the processed signal, respectively.
Figure 9:
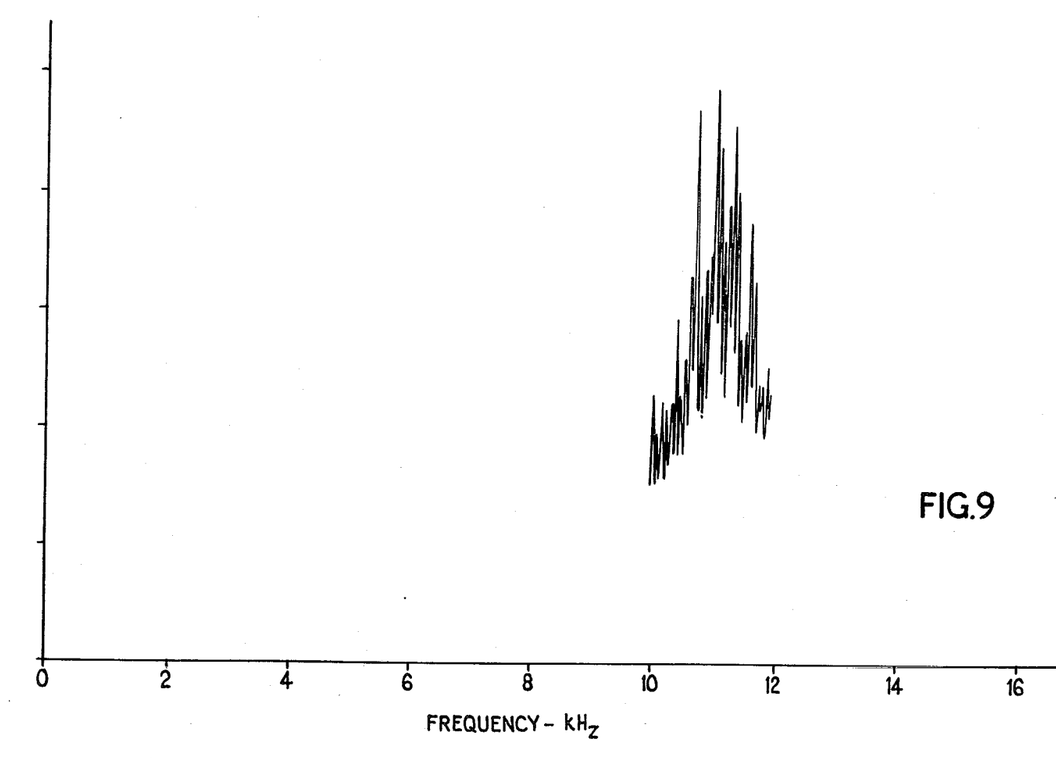

FIG. 7 shows a typical plot of noise signal against frequency for the range 10–12 KHz, the noise being generated by the turbine of a gas turbine engine. FIG. 8 shows the same signal but translated by the signal processing means described above to the frequency range 0–2 KHz, corresponding parts of the signal being referred to by the same reference letters. It will be clear that the frequency translation enables a frequency range to be examined in considerable detail because of the improved resolution.

The signal processing means is able to track a jittering signal if the input signal $W_o$ is derived from the source of the jitter, e.g. in the case of a gas turbine engine fan, $W_o$ can be derived from the tachometer measuring the rotational speed of the fan.

Referring now to FIGS. 10, 10a to 10d and to FIG. 5, the signal processing means can function as a filter by operation of switches 13, 14 so that both the digital function cotrollers are controlled by frequency $W_o$ and both the low pass filters are controlled by frequency 4 $W_o$.

Figures 10, 10D:
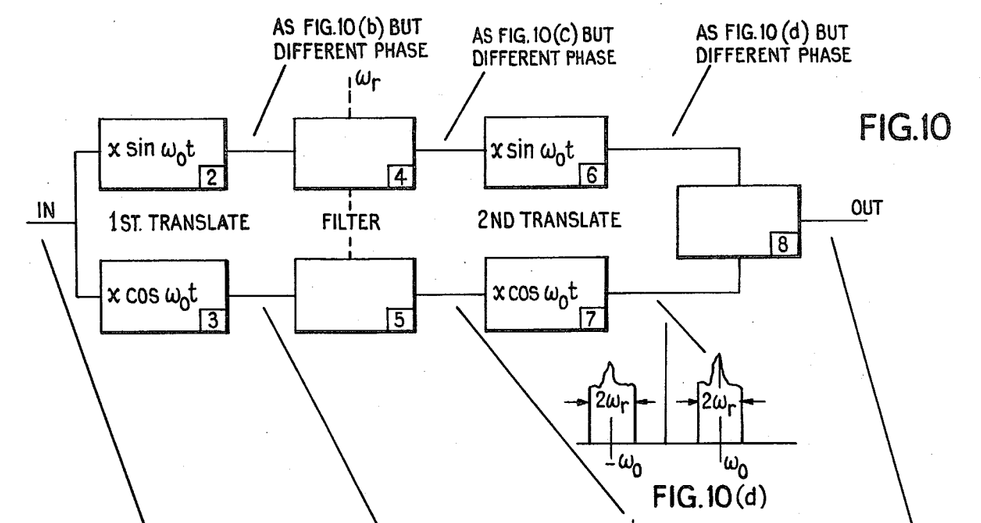
Figure 10A:
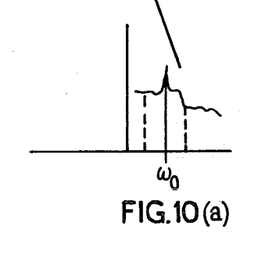
Figure 10B:
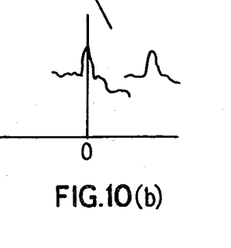
Figure 10C:
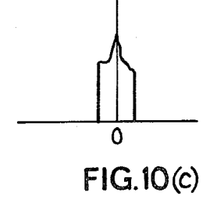

The signal processing means in the filter mode functions in the same way as it functions in the range translation mode up to the digital function controllers 6, 7. The multiplication of the signals from the low pass filters 4 and 5 by Sin $W_o t$ and Cos $W_o t$ respectively, translate the signal back to its original frequency as shown in FIGS. 10(d). As with FIG. 6(d) the spectrum shown is theoretical, since the negative frequency will be folded over the positive frequency signal. The signal from the amplifier 6 is the same as that from the amplifier 5 except for the difference in phase.

Figure 10E:
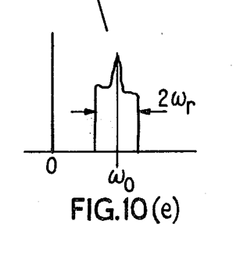

The signals from the amplifiers 6 and 7 are summed in the adder which cancels out half the frequency range of the signal because the signals from amplifiers band 7 are out of phase, to produce the signal in FIG. 10(e). This signal still includes some harmonics (not shown) generated once again because of the way in which the sine and cosine waves are produced by the digital function controller 11. These harmonic signals are filtered out by the low pass filter 9 now operating on a frequency of 4 $W_o$.

Thus the signal processing means of the invention is capable of acting as a constant bandwidth filter the frequency of which can be controlled by the input signal $W_o$ and the bandwidth of which can be controlled by the input signal $W_r$, the signals $W_o$ and $W_r$ being independent in this mode.

The signal processing means can also act as a constant percentage bandwidth filter by relating $W_o$ to $W_r$, and this arrangement can be useful when dealing with a bandwidth which is increasing and decreasing.

As mentioned previously, the digital function controllers 10 and 11 generate approximations to sine and cosine waves. It has been found practical to produce these approximations as a series of steps, so that a complete cycle of the control frequency is represented by say twelve steps, each step being assigned a unique whole number and representing the gain signal to the amplifiers 2, 3, 6 and 7.

Each controller 10, 11 comprises a multiplier which multiplies the incoming signal frequency i.e. either $W_o$ or $W_r$ by N where N=the number of steps in the approximation, in this case, twelve. The signal frequency is then divided by N in a counter which has four control outputs and produces twelve signals in binary code, each signal corresponding to one step in one cycle of either $W_o$ or $W_r$. These signals then pass to a ROM (Read only memory) which generates signals in binary code corresponding to the whole numbers representing the steps in the sine and cosine wave approximation. Thus the signals from the ROM control the gain of the amplifiers 2, 3, 6 and 7 in accordance with the twelve step approximation to the sine and cosine of either $W_o$ or $W_r$.

We claim:

1. Signal processing means comprising first filter means arranged to receive an input signal, two first programmable gain amplifier means arranged to receive a signal from the first filter means and controlled by first digital function controller means, second filter means arranged to receive the signals from the two first programmable gain amplifier means, two second programmable gain amplifier means arranged to receive the two signals from the second filter means and controlled by second digital function controller means, means for adding the output signals from the two second programmable gain amplifier means, third filter means arranged to receive the signal from the adding means and control frequency derivator means arrange to control the first, second and third filter means and the first and second digital function controller means, the control frequency derivator means being controlled by a centre frequency control input signal, and a bandwidth control input signal.

2. Signal processing means as claimed in claim 1 arranged to operate as a frequency range translator in which the control frequencies to the first filter means and the first digital function controller means are different functions of the centre frequency control input signal and the control signals to the third filter means and the second digital function controller means are different functions of the bandwidth input control signal.

3. Signal processing means as claimed in claim 1 in which the centre frequency control signal is a function of the bandwidth control signal.

4. Signal processing means as claimed in claim 1 arranged to operate as a filter in which the control frequencies to both digital function controller means are the same as each other and the control frequencies to the first and third filter means are the same as each other.

5. Signal processing means as claimed in claim 1 including switching means to switch operation of the said processing means between a frequency range translation mode in which the control frequencies to the first and second digital function controller means differ from each other and the control frequencies to the first and third filter means differ from each other, to a filter mode in which the control frequencies to the first and second digital function controller means are the same as each other and the control frequencies to the first and third filter means are the same as each other.

6. Signal processing means as claimed in claim 1 in which the control frequency to the second filter means is equal to the bandwidth control signal input.

7. Signal processing means as claimed in claim 1 in which each one of the digital function controller means generates digital approximations to sine and cosine waves, the said approximations being fed to respective ones of the first and second programmable gain amplifier means.

8. Signal processing means as claimed in claim 1 in which the first, second and third filter means, comprise low pass filters.

9. Signal processing means as claimed in claim 1 in which the second filter means comprise two low pass filters, one of each said low pass filters being associated with a respective one of the two first programmable gain amplifier means.

10. Signal processing means as claimed in claim 2 in which the control signal to the first digital function controller means is equal to the centre frequency input signal and the control signal to the first filter means is a multiple of the centre frequency input signal.

11. Signal processing means as claimed in claim 2 in which the control signal to the second digital function controller means is equal to the bandwidth input control signal and the control signal to the third filter means is a multiple of the bandwidth control input signal.

12. Signal processing means as claimed in claim 4 in which the control frequencies to both the digital function controller means are equal to the centre frequency control signal input and the control frequencies to the first and third filter means are equal to a multiple of the bandwidth control signal input.

13. Signal processing means as claimed in claim 12 in which the two control frequencies are controlled independently.

14. Signal processing means as claimed in claim 12 arranged to operate as a constant percentage bandwidth filter, the said two control frequencies being related to each other.

* * * * *